United States Patent [19]

Cox

[11] Patent Number: 4,785,237

[45] Date of Patent: Nov. 15, 1988

[54] AMPLIFIER WITH D.C. COMPENSATION

[75] Inventor: Mason F. Cox, Shelby, N.Y.

[73] Assignee: Monroe Electronics, Inc., Lyndonville, N.Y.

[21] Appl. No.: 45,207

[22] Filed: May 4, 1987

Related U.S. Application Data

[63] Continuation of Ser. No. 681,297, Dec. 13, 1984.

[51] Int. Cl.[4] .................. G01R 19/00; G01R 19/155
[52] U.S. Cl. ............................. 324/123 R; 324/72.5; 324/130; 328/162; 328/165
[58] Field of Search ............. 324/123 R, 130, 72, 324/109, 457, 458, 72.5; 330/9; 307/359, 491, 494, 490; 328/162, 165, 127, 128

[56] References Cited

U.S. PATENT DOCUMENTS

| | | | |
|---|---|---|---|
| 3,778,710 | 12/1973 | Snook | 330/9 |
| 3,801,919 | 4/1974 | Wilkes et al. | 330/9 |
| 4,121,154 | 10/1978 | Keating | 324/72 |
| 4,217,542 | 8/1980 | Abbe et al. | 324/130 |
| 4,370,616 | 1/1983 | Williams | 324/72 |
| 4,387,438 | 6/1983 | Lucich et al. | 328/165 |
| 4,461,182 | 7/1984 | Jones, Jr. et al. | 324/130 |
| 4,510,442 | 4/1985 | Neher | 324/130 |

FOREIGN PATENT DOCUMENTS 0149855  11/1980  Japan ............................ 324/457

Primary Examiner—Reinhard J. Eisenzopf
Assistant Examiner—W. Burns
Attorney, Agent, or Firm—Finnegan, Henderson, Farabow, Garrett & Dunner

[57] ABSTRACT

A circuit for providing DC bootstrapping to an AC amplifier integrates a sample of the output of the amplifier and feeds the result of that integration to the input of the amplifier, thereby driving the input of the amplifier to a zero potential level. The integration can be accomplished by an operator amplifier and a capacitor in a feedback circuit.

15 Claims, 2 Drawing Sheets ered by zener diodes 33 and 34 which are connected in
AMPLIFIER WITH D.C. COMPENSATION This application is a continuation of application Ser. No. 681,297, filed 12/13/84.

BACKGROUND OF THE INVENTION

The present invention relates to the field of bootstrapping circuits for amplifiers, and more particularly, to preamplifier circuits used with electrical fieldmeters, especially those meters with vibrating capacitor detectors.

One use of amplifiers, especially preamplifiers, is to increase the input impedance of a circuit. Certain electrical fieldmeters that contain vibrating capacitor detectors use preamplifiers for this purpose because a high input impedance allows most of the detected signal from the vibrating capacitor detector to be received by the remainder of the detection circuitry coupled to the preamplifier. Vibrating capacitor detectors are described in U.S. Pat. No. 3,611,127 to Vosteen and a paper by Mr. Vosteen entitled "D.C. Electrostatic Voltmeters And Fieldmeters" presented at the 9th Annual Meeting of IEEE-Industry Application Society (October, 1974). Both the patent and the article are incorporated herein by reference.

In vibrating capacitor detectors, an electromechanical driver vibrates an electrode adjacent an aperture in order to measure a surrounding electric field, for example, from a charged surface under measurement located near the aperture. Both the Vosteen patent and the article show such a detector as well as the use of feedback to drive the detector shield to the same potential as the electrode. This feedback creates an essentially zero field condition which does not disturb the charge distribution on the surface under measurement.

Prior attempts to increase the input impedance of circuitry coupled to a vibrating capacitor electrode have used techniques referred to as "AC bootstrapping" techniques. FIG. 1 shows an example of one such bootstrapping technique where the vibrating capacitor detector includes a vibrating electrode 1 and a driven shield 2 to detect the electric potential on a surface under measurement 10.

Oscillator 20 drives a coil which vibrates electrode 1 at a prescribed frequency, typically 700 Hz. The voltage induced on electrode 1 is one input to a preamplifier circuit which includes an LM741-type operational amplifier 30 (i.e., a high impedance type) configured as a voltage follower. The output of amplifier 30 is protected by zener diodes 33 and 34 which are connected in series and with opposing polarities between the output of operational amplifier 30 and ground. The values of the zener diodes depend on the supply voltage. For example, 11 volt zeners would be used for a 15 volt supply voltage.

Resistances R1-R3 and capacitor C1 provide AC bootstrapping. R2 and R3 are connected in series between ground and the noninverting input of operational amplifier 30. That input is also connected to vibrating electrode 1. R1 and C1 are connected in series between the output of amplifier 30 and the junction of resistors R2 and R3. The values of resistors R1-R3 and C1 are chosen to maximize the input impedance of the preamplifier at the frequency of interest, i.e. oscillator 20's frequency.

This type of A.C. bootstrapping was designed to maximize the transmission of signals at the desired (i.e., oscillator) frequency and to minimize the interference from signals at other frequencies. AC bootstrapping was also used to circumvent the disadvantages of voltage offset that occurred when the preamplifier's input impedance was increased by increasing D.C. resistance. For example, leakage currents inherent in operational amplifiers will flow through a resistance at the input of an operational amplifier and create undesirable offset voltages; the higher the resistance, the higher the offset.

AC bootstrapping, however, has several problems, including a lack of stability. The circuit in FIG. 1 is highly tuned. Stray signals may cause it to resonate at the tuned frequency even when there is no voltage change on the surface under test. The result is improper detection of fields and false alarms if the system is used as an alarm circuit. Furthermore, resistances R2 and R3 still cause undesirable voltage offsets and, at the tuned frequency, both the noise and the signal are amplified making it difficult to improve signal/noise ratios.

One object of the present invention is to increase an amplifier's input impedance without increasing its offset voltage.

Another object of the invention is an amplifier with a better signal/noise ratio than one employing AC bootstrapping.

A further object of the invention is an electric fieldmeter with high accuracy and stability.

SUMMARY OF THE INVENTION

The present invention overcomes the problems of the prior art and achieves the objects listed above by a DC bootstrapping technique. To achieve the objects, and in accordance with the purposes of the invention, as embodied and as broadly described herein, the amplifier circuit of this invention comprises an AC amplifier having input and output terminals, and means coupled between those input and output terminals for integrating the voltage at the output terminal of the amplifier and for feeding the result of that integration to the input terminal to counteract DC offset of the amplifier circuit.

The accompanying drawings, which are incorporated in and which constitute a part of this specification, illustrate preferred embodiments of this invention and, together with the description, explain the principles of this invention.

DESCRIPTION OF THE PREFERRED EMBODIMENTS

Reference will now be made in detail to the preferred embodiments of this invention, examples of which are illustrated in the accompanying drawings.

Figure 1:
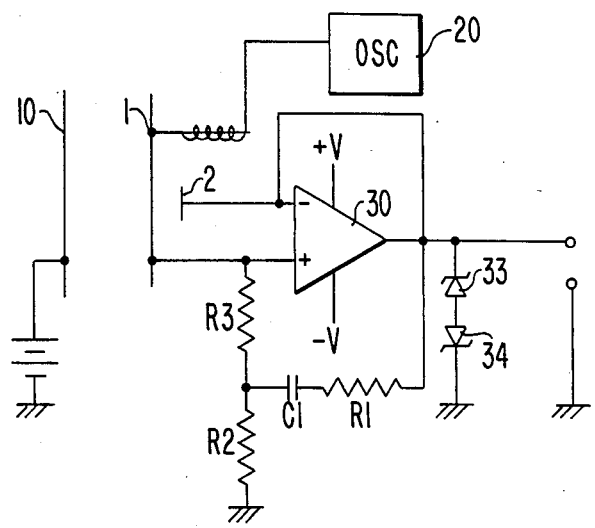
FIG. 1 depicts a prior art amplifier which uses AC bootstrapping.
Figure 2:
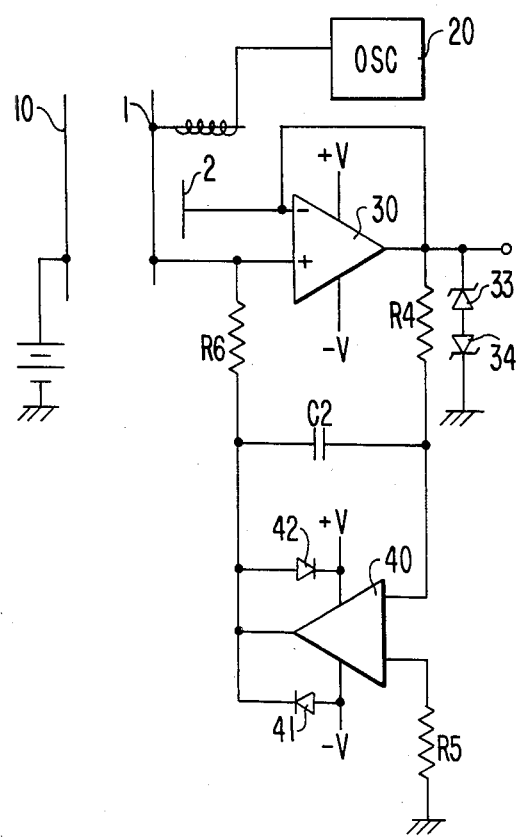
FIG. 2 shows an embodiment of an amplifier having D.C. bootstrapping in accordance with this invention.

FIG. 2 shows an amplifier according to the present invention coupled to a vibrating electrode detector. As in FIG. 1, oscillator 20 drives vibrating electrode 1, which is adjacent driven shield 2. As configured, the system measures the voltage at the surface under measurement 10. To make the device in FIG. 2 a true fieldmeter, a grounded gradient plate would need to be added between electrode 1 and the surface under measurement 10. This invention provides advantages for both electric fieldmeters and electric voltmeters, both of which are types of electric meters. In FIG. 2, shield 2 is connected to one input (inverting) of AC amplifier 30 and electrode 1 is connected to the other (non-inverting) input of amplifier 30. Amplifier 30 is configured as a voltage follower with its output coupled to its inverting input. Diodes 33 and 34 provide output protection.

In accordance with the present invention, the amplifier circuit includes means coupled between the input and output terminals of the AC amplifier for integrating the voltage at the amplifier output and for feeding the results of that integration to an input terminal of the AC amplifier to counteract DC offset.

In FIG. 2, such integrating means includes amplifier 40, one of whose inputs is connected to the output of amplifier 30 via resistor R4. The other input of amplifier 40 is connected to ground via resistor R5. Capacitor C2 bridges the output and the inverting input of amplifier 40, and the output of amplifier 40 is coupled to the noninverting input of amplifier 30 via input resistance R4. Diodes 41 and 42 protect amplifier 40 from large voltage surges in the system.

Amplifier 40 and the associated elements sample (filter) the voltage output of amplifier 30 and pass only DC components since any AC components integrate to zero. Since vibrating capacitor electrode 1 is an AC system, the prominent DC component is the offset voltage due to the product of amplifier 30's input bias current and R6. The result of the integration, or filtering, is used to counteract the offset voltage by adding, to the noninverting input of amplifier 30, a voltage which is opposite to such offset voltage.

This invention allows the input impedance of the preamplifier, resistor R6, to be very large without suffering from unacceptably large offset voltages. In addition, this DC bootstrapping technique does not suffer from problems of instability that plague AC bootstrapping techniques. This invention also provides several other advantages, for example, greater signal gain and bandwidth. In addition, there is also a lower offset voltage and a better signal/noise ratio than AC bootstrapping preamplifiers which increase amplifier noise at the frequency being examined. Table I below shows typical values for the components in FIG. 2:

TABLE I

| Amplifiers 30, 40 | LM741-type |
|---|---|
| Resistors R4, R5 | 2 M ohms |
| Resistor R6 | 100 M ohms |
| Capacitor C2 | 0.01 microfarads |
| Diodes 41 and 42 | IN4148 |

Figure 3:
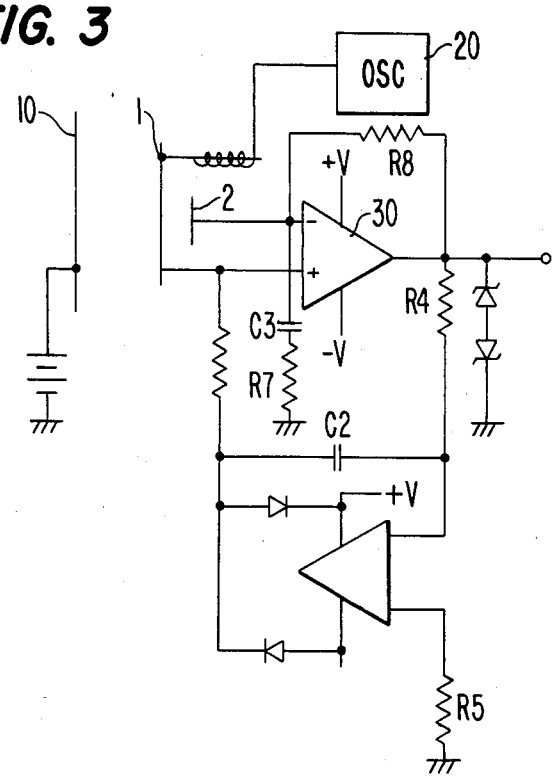
FIG. 3 shows another embodiment of this invention.

FIG. 3 shows a slight modification to the circuit of FIG. 2. Instead of amplifier 30 being configured as a voltage follower, amplifier 30 can have a predetermined gain set by resistor R8 between the output and inverting input of amplifier 30, and resistor R7 coupled to blocking capacitor C3 between ground and the inverting input of amplifier 30.

Figure 4:
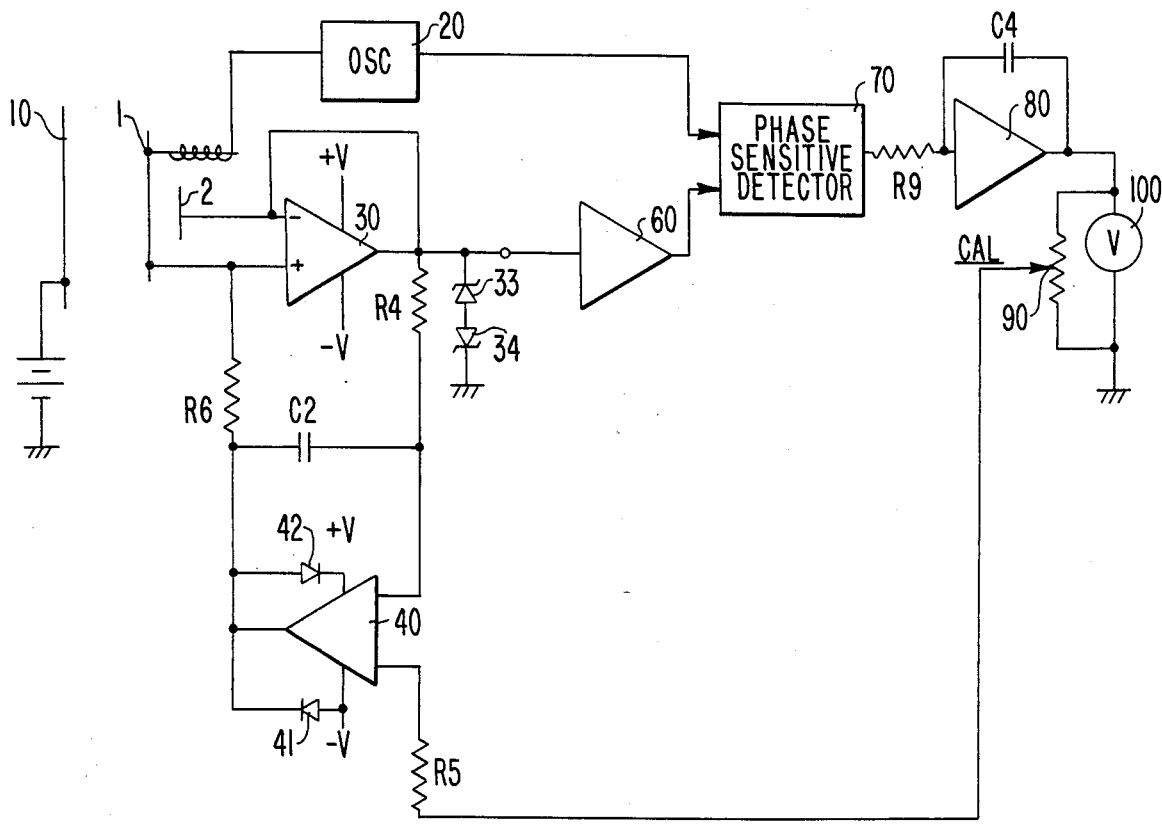
FIG. 4 shows an electric fieldmeter according to this invention.

FIG. 4 shows an electric fieldmeter in accordance with the present invention. The vibrating electrode detector and amplifiers 30 and 40, and components R4–R6, C2, 33, 34, 41 and 42 are configured as in FIG. 2. The output of amplifier 30 is also an input to AC amplifier 60 whose output, as well as that of oscillator 20, is an input to phase sensitive detector 70. Detector 70 compares the driving signal from oscillator 20 and the detected signal from vibrating capacitor electrode 1 and produces an output signal indicating the polarity and amplitude of the input signal.

The output of phase sensitive detector 70 is integrated by a circuit including amplifier 80 with resistor R9 connecting detector 70 and amplifier 80, and capacitor C4 connected between amplifier 80's input and output.

The field measurements are proportional to the output of amplifier 80 and are measured by voltmeter 100. Potentiometer 90, also coupled to the output of amplifier 80, selects a sample of that output for feedback to electrode 1. Such feedback drives the potential on vibrating electrode 1 back to A.C. zero to null the field of the detector.

In FIG. 4, feedback is accomplished by connecting the wiper of potentiometer 90 to an input of amplifier 40 via resistor R5. Because of the nature of operational amplifiers, the feedback voltage on one input of amplifier 40 will tend to drive the other input of amplifier 40 to the same potential. The other input of amplifier 40 is coupled to shield 2 via resistor R4 whose potential is essentially the same as that of electrode 1.

It will be apparent to those skilled in the art that modifications and variations can be made in the amplifier and fieldmeters of this invention. For example, this invention has application to other non-contacting A.C. electric probes in addition to the vibrating capacitor probe shown. This invention, in its broader aspects is not limited to the specific details and examples shown in the figures and described above. Departure may be made from such details and examples without departing from the spirit or scope of the invention.

What is claimed is:

1. An amplifier circuit for reducing DC offset in an electric meter comprising:
    an AC amplifier having an inverting input terminal, a noninverting input terminal, and an output terminal for amplifying an input signal received at said noninverting input terminal to create an output voltage signal at said output terminal; and
    means, coupled between said noninverting input and said output terminals, for integrating said output voltage signal at said output terminal of said AC amplifier while said input signal being received at said noninverting input terminal to impose an integration signal onto said noninverting input terminal for continuously driving a D.C. potential between said inverting and noninverting input terminals to a zero level to counteract any DC offsets occurring in said amplifier circuit during receipt of said input signal.

2. The amplifier circuit of claim 1 wherein said AC amplifier comprises a first operational amplifier having said inverting and noninverting input terminals and said output terminal; and wherein said integrating means includes
    a second operational amplifier having an integration output terminal and a first integration input terminal, and
    a first capacitor coupled between said integration output terminal and said first integration input terminal of said second operational amplifier.

3. The amplifier circuit of claim 2 further including a first resistance connected between said integration output terminal of said second operational amplifier and said noninverting input terminal of said first operational amplifier;

wherein said second operational amplifier includes a second integration input terminal; and wherein said integrating means further includes a second resistance connected between said output terminal of said first operational amplifier and said first integration input of said second operational amplifier, and a third resistance coupled between said second integration input terminal of said second operational amplifier and a ground potential.

4. An electric meter comprising:

a non-contacting AC electric probe producing an input signal;

an AC amplifier having inverting and noninverting input terminals and an output terminal, said noninverting input terminal being coupled to said electric probe to receive said input signal; and means coupled between said noninverting input terminal and said output terminal of said AC amplifier for integrating a signal at said output terminal to produce an integration signal which is coupled to said noninverting terminal and for driving a D.C. potential between said inverting and noninverting input terminals of said AC amplifier to a zero level using said integration signal during receipt of said input signal, thereby to counteract any DC offsets in said electric meter.

5. The meter of claim 4 wherein said AC amplifier comprises a first operational amplifier having said inverting and noninverting input terminals and said output terminal; and wherein said integratiing means includes a second operational amplifier having an integration input terminal and an integration output terminal, and a first capacitor coupled between said integration input terminal of said second operational amplifer and said integration output terminal of said second operational amplifer.

6. The meter of claim 5 wherein said AC amplifier is configured as a voltage follower.

7. The meter of claim 5 wherein said AC amplifier includes a inverting resistance coupled between the output and first input terminals of said first operational amplifier, and further includes a second resistance coupled between said inverting input terminal and a ground potential.

8. The meter of claim 5 wherein said electric probe is a vibrating capacitor probe.

9. An electric meter comprising:

a vibrating capacitor probe including a vibrating electrode and a driven shield;

means for controlling the potential of said vibrating electrode;

an AC amplifier having first and second input terminals and an output terminal, said inverting input terminal being coupled to said vibrating electrode and said first terminal being coupled to said driven shield, said AC amplifier producing an output signal at said output terminal; and means coupled between said output terminal and said second input terminal of said AC amplifier for integrating said output signal at said output terminal to form an integration signal and for coupling said integration signal to said second input terminal.

10. The meter of claim 9 wherein said AC amplifier comprises a first opertional amplifier; and wherein said integrating means includes a second operational amplifier having first and second integration input terminals and an integration output terminal, and a first capacitor coupled between said first integration input terminal and said integration output terminal of said second operational amplifier.

11. The meter of claim 9 wherein said zeroing means includes an integrating circuit coupled to an output of said phase sensitive detector, and a potentiometer coupled between said integrating circuit and said second integration input terminal of said second operational amplifier.

12. An electric meter comprising:

a vibrating capacitor probe having a vibrating electrode and a driven shield;

means for controlling the potential of said vibrating electrode including an oscillator for driving said vibrating electrode at a preset frequency, a phase sensitive detector coupled to said oscillator, and zeroing means, coupled to the output of said phase sensitive detector, for generating a feedback signal to drive said vibrating electrode to a potential level of zero volts;

an AC amplifier including a first operational amplifier with first and second input terminals and an output terminal, said first input terminal being coupled to said vibrating electrode, said second input terminal being coupled to said driven shield, and said output terminal being coupled to said phase sensitive detector and presenting an output signal; and integrating means, coupled to said potential controlling means to receive said feedback signal, to said output terminal of said first operational amplifier and to said first input terminal of said operational amplifier to present an integration signal, for integrating said output signal and said feedback signal to form said integration signal, said integrating means including a second operational amplifier, having a first integration input terminal coupled to receive said output signal, a second integration input terminal coupled to receive said feedback signal, and having an integration output terminal coupled to said first input terminal of said AC amplifier, and a capacitor coupled between said first integration input terminal and said integration output terminal of said second operational amplifier.

13. An amplifier circuit for reducing DC offset in an electric meter comprising:

an AC amplifier having an inverting input terminal, a noninverting input terminal, and an output terminal for amplifying an input signal received at said noninverting input terminal to create an output voltage signal at said output terminal, said AC amplifier being configured as a voltage follower and including a first operational amplifier having said inverting and noninverting input terminals and said output terminal; and inverting means, coupled between said noninverting and said output terminals, for integrating said output voltage signal at said output terminal of said AC amplifier while said input signal is being received at said noninverting input terminal to impose an integration signal onto said noninverting input terminal for continuously driving a DC potential between said inverting and noninverting input terminals to a zero level to counteract any DC offsets occurring in said amplifier circuit during receipt of said input signal, said integrating means including
  a second operational amplifier having an integration output terminal and a integration input terminal, and
  a first capacitor coupled between said integration output terminal and said integration input terminal of said second operational amplifier.

14. An amplifier for reducing DC offset in an electric meter comprising:
  an AC amplifier having an inverting input terminal, a noninverting terminal, and an output terminal for amplifyiing an input signal received at said noninverting input terminal to create an output voltage at said output terminal, said AC amplifier including
    a first operational amplifier having said inverting and noninverting input terminals and said output terminal,
    a first resistance coupled between said output and inverting input terminals of said first operational amplifier, and
    a second resistance coupled between said inverting input terminal of said first operational amplifier and a ground potential; and
  integration means, coupled between said noninverting input and said output terminals, for integrating said output voltage signal at said output terminal of said AC amplifier while said input signal is being received at said noninverting input terminal to impose an integration signal onto said noninverting input terminal or continuously driving a DC potential between said inverting and noninverting input terminals to to a zero level to counteract and DC offsets occurring in said amplifier circuit during receipt of said input signal, said integrating means including
    a second operational amplifier having an integration output terminal and a integration input terminal, and
    a first capacitor coupled between said integration output terminal and said integration input terminal of said second operational amplifier.

15. An electric meter comprising:
  a non-contacting AC electric probe producing an input signal and having a shield;
  an AC amplifier having inverting and noninverting input terminals and an output terminal, said noninverting input terminal being coupled to said electric probe to receive said input signal and said inverting terminal being connected to said shield; and
  means coupled between said non-inverting input terminal and said output terminal of said AC amplifier for integrating a signal at said output terminal to produce an integration signal which is coupled to said noninverting terminal for driving a DC potential between said inverting and noninverting input terminals of said AC amplifier to a zero level using said integration signal during receipt of said input signal, thereby to counteract any DC offsets in said electric meter.

* * * * *